United States Patent [19]

Yamaka et al.

[11] Patent Number: 4,939,561
[45] Date of Patent: Jul. 3, 1990

[54] INFRARED SENSOR

[75] Inventors: Eiso Yamaka, Ushiku; Fumio Hasegawa, Tsukuba; Takashi Moriyama, Kashiwa; Tamisuke Koizumi, Matsudo, all of Japan

[73] Assignees: National Space Development Agency of Japan; Foundation for Advancement of International Science, both of Japan

[21] Appl. No.: 327,455

[22] Filed: Mar. 22, 1989

[30] Foreign Application Priority Data

Mar. 24, 1988 [JP] Japan .................... 63-70808

[51] Int. Cl.$^5$ .................... H01L 27/14; H01L 31/00; H01L 29/48; H01L 29/161
[52] U.S. Cl. .................... 357/30; 357/15; 357/16
[58] Field of Search ............... 357/15, 16, 30 C, 30 E, 357/30 N, 24 LR

[56] References Cited

U.S. PATENT DOCUMENTS 4,661,829 4/1987 Bean et al. .................... 357/30
4,725,870 2/1988 Bean et al. .................... 357/30
4,831,428 5/1989 Yamaka .................... 357/30

FOREIGN PATENT DOCUMENTS 2053567 2/1981 United Kingdom .

OTHER PUBLICATIONS

"IrSi Schottky-Barrier Infrared Image Sensor" by N. Yutani et al., 1987 IEEE Int. Electron Devices Meeting, pp. 124-127.

Primary Examiner—Gene M. Munson
Attorney, Agent, or Firm—Lowe, Price, LeBlanc, Becker & Shur

[57] ABSTRACT

An infrared sensor includes a metal and a semiconductor contacted to each other via a rectifying potential barrier. The semiconductor includes a p-type strained $Si_{1-x}Ge_x$ epitaxial layer grown on a p-type substrate, wherein the character X denotes a Ge atomic fraction and wherein X increases from zero to a predetermined upper limit in a direction away from the Si substrate toward the metal. The metal may be selected from the group of Pt, an alloy of Pt and Si, and an alloy of Pt, Si, and Ge. In addition, the metal may also be selected from the group of Ir, an alloy of Ir and Si, and an alloy of Ir, Si, and Ge.

10 Claims, 6 Drawing Sheets

4,939,561

INFRARED SENSOR

BACKGROUND OF THE INVENTION

1. Field of the Invention

This invention relates to an infrared sensor of a Schottky barrier diode type. This invention also relates to an infrared camera including such an infrared sensor.

2. Description of the Prior Art

Infrared sensors are basically of a pyroelectric type or a quantum type. Some quantum-type infrared sensors use the photoconductivity of an intrinsic semiconductor, such as HgCdTe, which has a band gap of 0.1-0.3 eV. Other quantum-type infrared sensors use the photoelectric effect of a Schottky barrier diode, such as Pt/p-type Si, which has a small barrier height.

Advanced visible light image sensors already use charge-coupled devices (CCD) of Si. It has been desired to combine an infrared sensor and CCD to realize a CCD infrared image sensor.

Pyroelectric-type infrared sensors have slow response speeds so that they are unsuited for infrared image sensors.

Intrinsic semiconductors such as HgCdTe have high sensitivities and are also excellent in the flexibility of sensed wavelengths due to an easy change of their band gaps. However, it is generally difficult to combine such a narrow band gap intrinsic semiconductor and Si-CCD to form a CCD image sensor.

Infrared sensors using Schottky barriers of Pt/p-type Si or PtSi/p-type Si are most excellent in the characteristic of matching to CCD. FIG. 3 shows an energy band diagram of a PtSi-p-type Si Schottky barrier diode. The height of a barrier of this diode is about 0.23 eV, and the barrier height is determined by the substance. Accordingly, the photoelectric sensitivity of such an infrared sensor becomes inadequate at infrared light wavelengths longer than about 5 micrometers. In other words, the longer limit of sensible wavelengths is about 5 micrometers.

N. Yutani et al., Technical Digest of Int. Electron Device Meeting, 1987, pages 124-127, report that when Pt was replaced by Ir in PtSi/p-type Si, the barrier height decreased to about 0.17 eV and, as shown in FIG. 5, the longer limit of sensible wavelengths was about 7 micrometers. However, the longer limit of sensible wavelengths is determined by the substance, and it is generally difficult to further lengthen the longer limit.

SUMMARY OF THE INVENTION

It is an object of this invention to provide a Schottky-barrier type infrared sensor which has an adequate photoelectric sensitivity at long infrared wavelengths and which can be easily combined with CCD.

An infrared sensor of this invention includes a metal and a semiconductor contacted to each other via a rectifying potential barrier. The semiconductor includes a p-type strained $Si_{1-X}Ge_X$ epitaxial alloy layer grown on a p-type substrate, where the character X denotes the atomic fraction of Ge in the SiGe alloy. The metal may be selected from the group of Pt, an alloy of Pt and Si, and an alloy of Pt, Si, and Ge. In addition, the metal may also be selected from the group of Ir, an alloy of Ir and Si, and an alloy of Ir, Si, and Ge.

A CCD infrared camera of this invention includes an infrared sensor which has a metal and a semiconductor contacted to each other via a rectifying potential barrier. The semiconductor includes a p-type strained $Si_{1-X}Ge_X$ epitaxial alloy layer grown on a p-type Si substrate, where the character X denotes the Ge atomic fraction in the alloy.

DESCRIPTION OF THE PREFERRED EMBODIMENTS

This invention is generally directed to an infrared sensor including a metal-semiconductor rectifying contact. The semiconductor is composed of a p-type strained $Si_{1-X}Ge_X$ epitaxial layer grown on a p-type Si substrate. The metal is in the form of a film extending on the semiconductor. The metal is made of Pt, an alloy of Pt and Si, or an alloy of Pt, Si, and Ge. The metal may be made of Ir, an alloy of Ir and Si, or an alloy of Ir, Si, and Ge.

This invention is also directed to an infrared camera having a photosensitive section including the above-mentioned infrared sensor.

During the fabrication of the infrared sensor, an alloy crystal film of Si and Ge is formed on an Si substrate by epitaxial growth. The addition of Ge causes a decrease in a forbidden band gap and also a decrease in the barrier height of a Schottky diode. As a result, the photoelectric sensitivity of the infrared sensor is extended to longer wavelengths of infrared light than those in a prior art infrared sensor using a Pt/p-type Si Schottky barrier diode.

Figure 6:
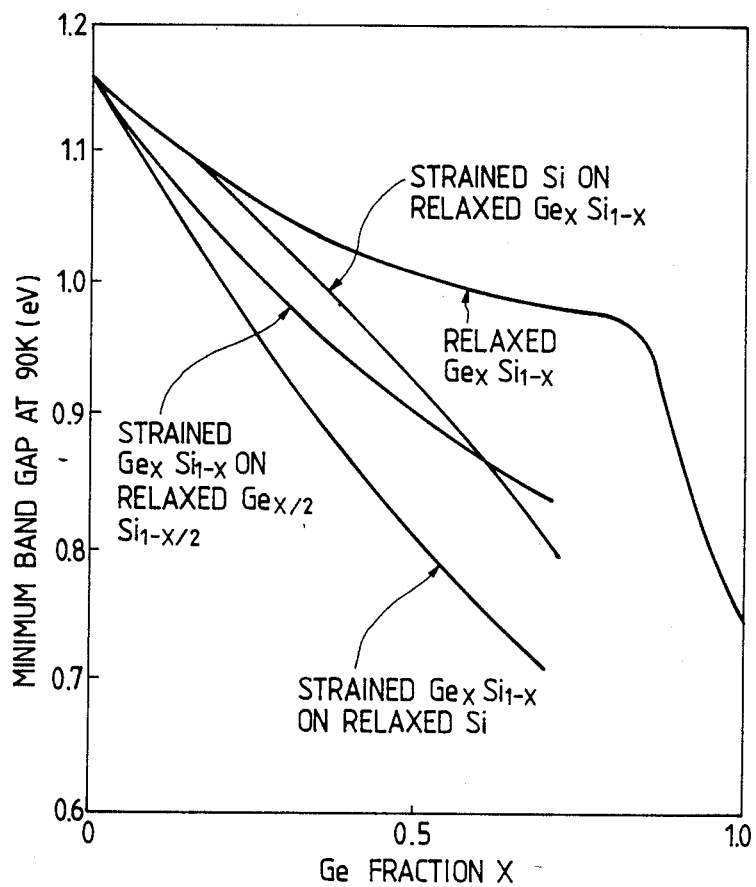
FIG. 6 is a diagram showing the relationships between forbidden band gaps and Ge atomic fractions in $Si_{1-X}Ge_X$ alloy crystals.

FIG. 6 shows the band gap of a strained or a relaxed $Si_{1-X}Ge_X$ alloy crystal grown on a Si substrate. As shown in FIG. 6, the forbidden band gaps of $Si_{1-X}Ge_X$ alloy crystal films decrease with an increase in the Ge fraction X. Furthermore, the band gap of a strained (commensurate) $Si_{1-X}Ge_X$ film is smaller than that of a relaxed (incommensurate) $Si_{1-X}Ge_X$ film for the same Ge fraction X.

Figure 7:
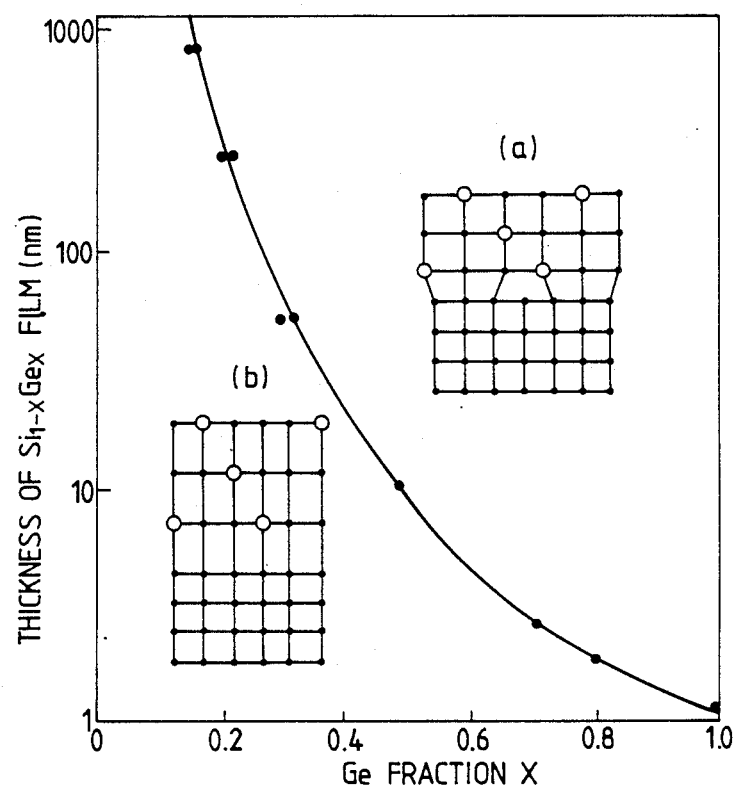
FIG. 7 is a diagram showing the relationship between the critical thickness of the commensurate $Si_{1-X}Ge_X$ film on the Si substrate and the Ge fraction X.

FIG. 7 shows the relationship between the critical layer thickness of a strained $Si_{1-X}Ge_X$ alloy crystal grown on a Si substrate as a function of the Ge fraction. In a thin $Si_{1-X}Ge_X$ epitaxial layer where a lattice constant of Ge (which is greater than that of Si) is equal to that of the Si substrate as shown in FIG. 7(b), it is understood from FIG. 6 that the band gap decreases by about 0.3 eV as the Ge fraction X increases to about 0.3. If a half of this band gap decrease contributes to an increase in the energy level of the valence band, it is expected that the Schottky barrier height of PtSi/p-type $Si_{0.7}Ge_{0.3}$ is lower than that of PtSi/p-type Si by about 0.15 eV.

Figure 1:
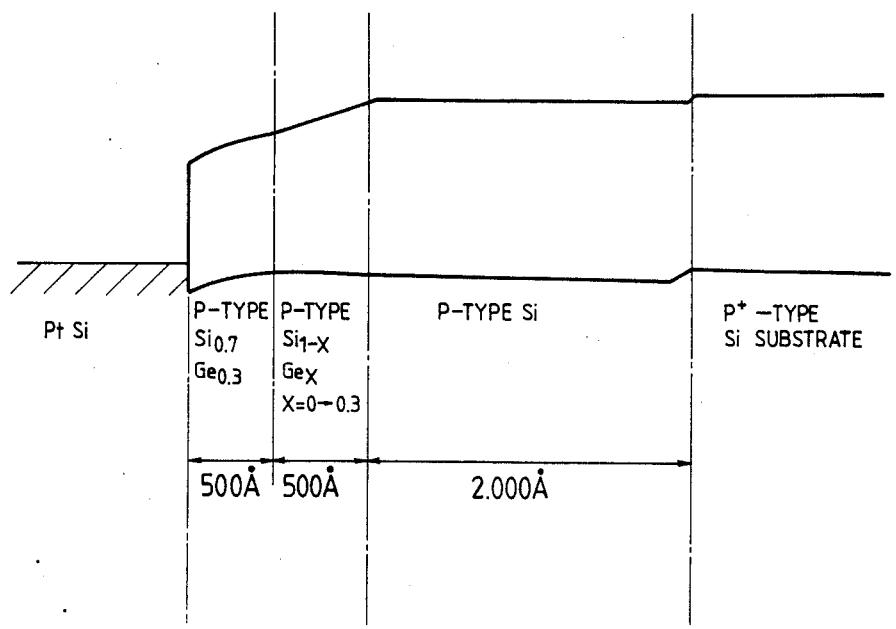
FIG. 1 is a diagram of energy bands of a PtSi/p-type $Si_{1-X}Ge_X$ Schottky barrier diode according to this invention.

FIG. 1 shows the energy band diagram of a structure which is fabricated in the following steps. Firstly, a p-type Si layer is grown on a p+-type Si substrate. Secondly, a p-type $Si_{1-x}Ge_x$ alloy crystal layer is grown on the p-type Si layer. In the p-type $Si_{1-x}Ge_x$ alloy crystal layer, the Ge fraction X increases from 0 to 0.3 in a direction away from the p-type Si layer. Thirdly, a p-type $Si_{0.7}Ge_{0.3}$ alloy crystal layer is grown on the p-type $Si_{1-x}Ge_x$ crystal layer. Finally, a PtSi layer is formed on the p-type $Si_{0.7}Ge_{0.3}$ alloy crystal layer to provide a Schottky barrier diode.

Specifically, the $Si_{1-x}Ge_x$ layer is grown on a p-type (100) Czochralski Si substrate by using MBE method. The base pressure of the MBE system is about $3\times10^{-10}$ torr. Si is evaporated by an electron beam gun and Ge is by a usual Knudsen-cell. The intensities of Si and Ge molecular beams are controlled by using Electron Impact Emission Spectroscopy (EIES) sensor (Inficon. Co., Ltd. Sentinel III).

One sample of the infrared sensor was fabricated as follows. As shown in FIG. 1, a p-type Si layer was grown on a p+-type Si substrate by the molecular beam epitaxy. The p+-type Si substrate had a carrier concentration of $8\times10^{18}$ cm$^{-3}$. The p-type Si layer had a carrier concentration of $3\times10^{16}$ cm$^{-3}$ and a thickness of 2,000 angstroms. Then, a p-type $Si_{1-x}Ge_x$ graded layer was grown on the p-type Si layer by the molecular beam epitaxy. The p-type $Si_{1-x}Ge_x$ graded layer had a carrier concentration of $3\times10^{16}$ cm$^{-3}$ and a thickness of 500 angstroms. In this p-type $Si_{1-x}Ge_x$ graded layer, the Ge content was changed gradually, i.e., the Ge fraction X was increased from 0 to 0.3 in a direction away from the p-type Si layer. Thereafter, a p-type $Si_{0.7}Ge_{0.3}$ alloy crystal layer was grown on the p-type $Si_{1-x}Ge_x$ alloy crystal layer by the molecular beam epitaxy. The p-type $Si_{0.7}Ge_{0.3}$ alloy crystal layer had a carrier concentration of $3\times10^{16}$ cm$^{-3}$ and a thickness of 500 angstroms. In this way, a laminated body of the substrate and the epitaxial layers was produced.

A Pt layer was formed on the laminated body by vacuum deposition. Specifically, the Pt layer extended on the p-type $Si_{0.7}Ge_{0.3}$ alloy crystal layer. The Pt layer had a thickness of 100 angstroms. The laminated body with the Pt layer was heated at 350° C. for 15 minutes so that a thin film of an alloy of Pt and Si was formed. In this way, a PtSi-p-type $Ge_{0.3}Si_{0.7}$ Schottky barrier diode was formed.

It should be noted that the Ge may be contained in the PtSi alloy and that the PtSi alloy may be replaced by a film of an alloy of Ir and Si, or a film of an alloy of Ir, Si, and Ge.

Other samples of the infrared sensor were similarly fabricated in which the p-type $Si_{0.7}Ge_{0.3}$ alloy crystal layer was replaced by a p-type $Si0.93Ge_{0.07}$ alloy crystal layer, a p-type $Si_{0.85}Ge_{0.15}$ alloy crystal layer, or a p-type $Si_{0.79}Ge_{0.21}$ alloy crystal layer. The samples of the infrared sensor were compared in electrical characteristics.

Figure 2:
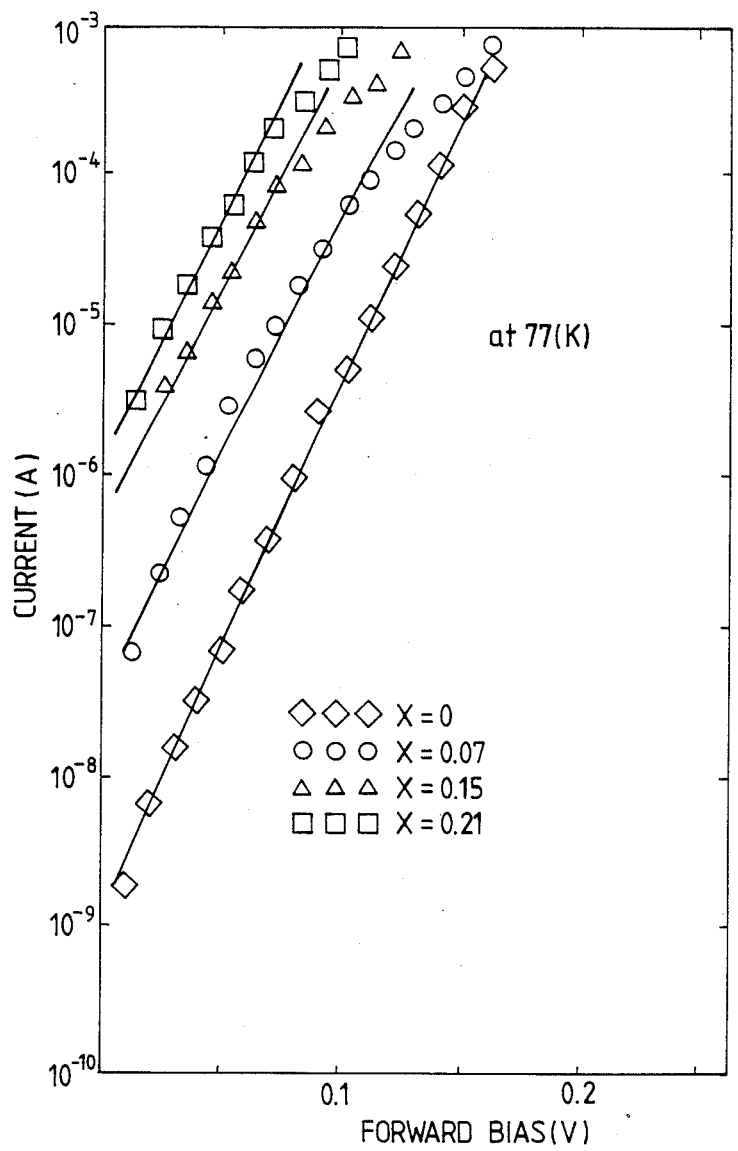
FIG. 2 is a diagram of forward current-voltage characteristics of PtSi/p-type $Si_{1-X}Ge_X$ Schottky barrier diodes at a temperature of 77 K where the Ge atomic fraction X is taken as a parameter.
Figure 3:
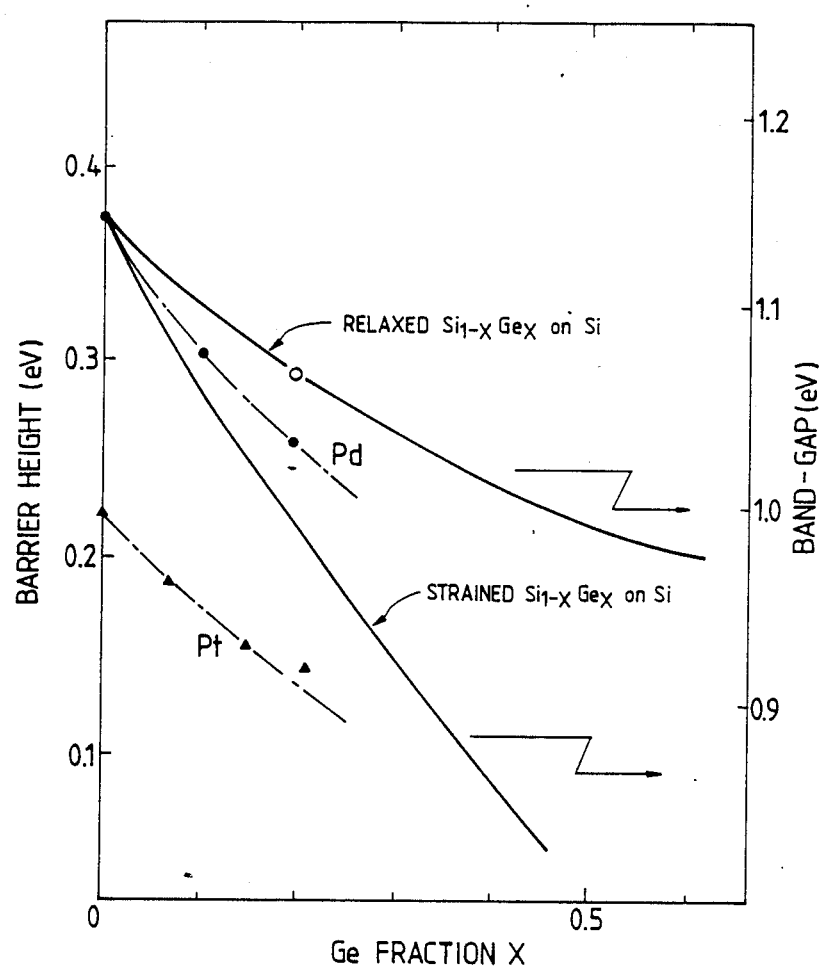
FIG. 3 is a graph showing the summary of the Schottky barrier height as a function of the Ge fraction X, in comparison with a change of the band gap.
Figure 4:
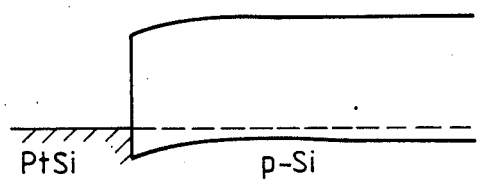
FIG. 4 is a diagram of energy bands of a PtSi/p-type Si Schottky barrier diode.
Figure 5:
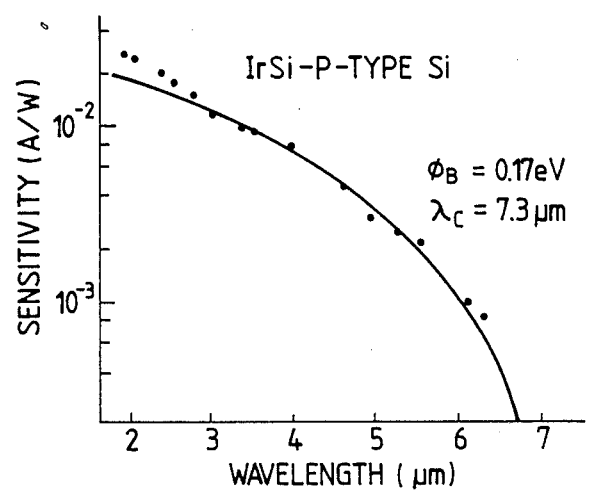
FIG. 5 is a diagram of infrared response characteristics of an IrSi/p-type Si Schottky barrier diode.

FIG. 2 shows forward current-voltage characteristics of the previously-mentioned samples, that is, the PtSi/p-type $Si_{1-x}Ge_x$ Schottky barrier diodes. FIG. 2 also shows forward current-voltage characteristics of a PtSi/p-type Si Schottky barrier diode. The forward current-voltage characteristics of FIG. 2 were obtained at 77 K.

The barrier height of these PtSi Schottky barrier diodes are calculated from the current-voltage characteristics of FIG. 2 in a known way. The calculated barrier heights are 0.19, 0.16, 0.14, and 0.13 eV at a Ge fraction X of 0, 0.07, 0.15, and 0.21 respectively. Thus, an increase in the Ge fraction X decreases the barrier height and thus lengthens the longer limit of sensible wavelengths of infrared ray.

In another sample of the infrared sensor, a p-type Si layer has a carrier concentration of $3\times10^{17}$ cm$^{-3}$ and a thickness of 500 angstroms. A p-type $Si_{1-x}Ge_x$ graded layer has a carrier concentration of $7\times10^{17}$ cm$^{-3}$ and a thickness of 1,500 angstroms. In this p-type $Si_{1-x}Ge_x$ graded layer, the Ge content is changed gradually, i.e., the Ge fraction X is increased from 0 to 0.3 in a direction away from the p-type Si layer. A p-type $Si_{0.7}Ge_{0.3}$ alloy crystal layer has a carrier concentration of $7\times10^{17}$ cm$^{-3}$ and a thickness of 300 angstroms.

As described previously, the Ge fraction X in the $Si_{1-x}Ge_x$ graded layer varies from 0 to a predetermined upper limit. It was experimentally found that, in the case of PtSi/p-type $Si_{1-x}Ge_x$ infrared sensors, the upper limit of the Ge fraction X was preferably in the range of 0.25 to 0.35. In the case of IrSi/p-type $Si_{1-x}Ge_x$ infrared sensors, the upper limit of the Ge fraction X was preferably in the range of 0.20 to 0.30.

What is claimed is:

1. An infrared sensor, comprising a PtSi metal and a semiconductor contacted to each other via a rectifying potential barrier, the semiconductor including a p-type $Si_{1-x}Ge_x$ epitaxial alloy crystal layer grown on an Si substrate, wherein X denotes the Ge atomic fraction in the p-type $Si_{1-x}Ge_x$ epitaxial alloy crystal layer, wherein the Ge atomic fraction X in the p-type $Si_{1-x}Ge_x$ epitaxial alloy crystal layer increases from zero to a predetermined upper limit in a direction away from the Si substrate toward the PtSi metal, and wherein the upper limit is in the range of 0.25 to 0.35.

2. The infrared sensor of claim 1, wherein the p-type $Si_{1-x}Ge_x$ epitaxial alloy crystal layer comprises a first sub layer and a second sub layer, the second sub layer extending between the first sub layer and the PtSi metal, the first sub layer having a Ge atomic fraction X which increases from zero to the predetermined upper limit in a direction away from the Si substrate toward the PtSi metal, and the second sub layer having a constant Ge atomic fraction X equal to the predetermined upper limit.

3. The infrared sensor of claim 2, wherein the first sub layer has a thickness of 500 angstroms and the second sub layer has a thickness of 500 angstroms.

4. The infrared sensor of claim 1, further comprising a p-type Si layer extending between the Si substrate and the p-type $Si_{1-x}Ge_x$ epitaxial alloy crystal layer.

5. The infrared sensor of claim 4, wherein the p-type Si layer has a thickness of 2,000 angstroms.

6. An infrared sensor, comprising an IrSi metal and a semiconductor contacted to each other via a rectifying potential barrier, the semiconductor including a p-type $Si_{1-x}Ge_x$ epitaxial alloy crystal layer grown in a Si substrate, wherein X denotes the Ge atomic fraction in the p-type $Si_{1-x}Ge_x$ epitaxial alloy crystal layer, wherein the Ge atomic fraction X in the p-type $Si_{1-x}Ge_x$ epitaxial alloy crystal layer increases from zero to a predetermined upper limit in a direction away from the Si substrate toward the IrSi metal, and wherein the upper limit is in the range of 0.20 to 0.30.

7. The infrared sensor of claim 6, wherein the p-type $Si_{1-x}Ge_x$ epitaxial alloy crystal layer comprises a first sub layer and a second sub layer, the second sub layer extending between the first sub layer and the IrSi metal, the first sub layer having a Ge atomic fraction X which increases from zero to the predetermined upper limit in a direction away from the Si substrate toward the IrSi metal, and the second sub layer having a constant Ge atomic fraction X equal to the predetermined upper limit.

8. The infrared sensor of claim 7, wherein the first sub layer has a thickness of 500 angstroms and the second sub layer has a thickness of 500 angstroms.

9. The infrared sensor of claim 6, further comprising a p-type Si layer extending between the Si substrate and the p-type $Si_{1-x}Ge_x$ epitaxial alloy crystal layer.

10. The infrared sensor of claim 9, wherein the p-type Si layer has a thickness of 2,000 angstroms.

* * * * *